United States Patent
Zhang et al.

(10) Patent No.: US 10,752,514 B2
(45) Date of Patent: Aug. 25, 2020

(54) METAL CHALCOGENIDE SYNTHESIS METHOD AND APPLICATIONS

(71) Applicant: CORNELL UNIVERSITY, Ithaca, NY (US)

(72) Inventors: Haitao Zhang, Ithaca, NY (US); Richard D. Robinson, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 14/426,281

(22) PCT Filed: Sep. 9, 2013

(86) PCT No.: PCT/US2013/058676
§ 371 (c)(1),
(2) Date: Mar. 5, 2015

(87) PCT Pub. No.: WO2014/039937
PCT Pub. Date: Mar. 13, 2014

(65) Prior Publication Data
US 2015/0225254 A1    Aug. 13, 2015

Related U.S. Application Data

(60) Provisional application No. 61/698,066, filed on Sep. 7, 2012.

(51) Int. Cl.

| | | |
|---|---|---|
| *C09K 11/74* | (2006.01) | |
| *C09K 11/58* | (2006.01) | |
| *B82Y 30/00* | (2011.01) | |
| *C01G 45/00* | (2006.01) | |
| *C01G 19/00* | (2006.01) | |
| *C01G 29/00* | (2006.01) | |
| *C01G 3/12* | (2006.01) | |
| *C01G 5/00* | (2006.01) | |
| *C01G 9/08* | (2006.01) | |
| *C01G 49/12* | (2006.01) | |
| *C30B 29/46* | (2006.01) | |
| *C30B 29/50* | (2006.01) | |
| *C30B 7/14* | (2006.01) | |
| *C01B 19/00* | (2006.01) | |
| *C09K 11/56* | (2006.01) | |
| *C01B 17/20* | (2006.01) | |
| *C30B 29/60* | (2006.01) | |
| *C01G 11/02* | (2006.01) | |

(52) U.S. Cl.
CPC ............. *C01G 45/00* (2013.01); *B82Y 30/00* (2013.01); *C01B 17/20* (2013.01); *C01B 19/007* (2013.01); *C01G 3/12* (2013.01); *C01G 5/00* (2013.01); *C01G 9/08* (2013.01); *C01G 11/02* (2013.01); *C01G 19/00* (2013.01); *C01G 29/00* (2013.01); *C01G 49/12* (2013.01); *C09K 11/565* (2013.01); *C09K 11/582* (2013.01); *C09K 11/7407* (2013.01); *C30B 7/14* (2013.01); *C30B 29/46* (2013.01); *C30B 29/50* (2013.01); *C30B 29/60* (2013.01); *C01P 2002/60* (2013.01); *C01P 2002/72* (2013.01); *C01P 2002/84* (2013.01); *C01P 2004/04* (2013.01); *C01P 2004/64* (2013.01); *C01P 2006/80* (2013.01)

(58) Field of Classification Search
None
See application file for complete search history.

(56) References Cited

U.S. PATENT DOCUMENTS

| | | |
|---|---|---|
| 6,126,740 A | 10/2000 | Schulz et al. |
| 6,872,249 B2 | 3/2005 | Peng et al. |
| 7,138,098 B2 | 11/2006 | Bawendi et al. |
| 7,273,904 B2 | 9/2007 | Peng et al. |
| 7,341,917 B2 | 3/2008 | Milliron et al. |
| 7,670,584 B2 | 3/2010 | Caldwell et al. |
| 8,247,795 B2 | 8/2012 | Jun et al. |
| 8,309,170 B2 | 11/2012 | Jang et al. |
| 2002/0071952 A1 | 6/2002 | Bawendi et al. |
| 2004/0103936 A1* | 6/2004 | Andriessen ......... H01L 31/0352 136/252 |
| 2005/0059545 A1 | 3/2005 | Alonso et al. |
| 2006/0039850 A1 | 2/2006 | Jun et al. |
| 2007/0269991 A1* | 11/2007 | Jang ..................... B82Y 15/00 438/778 |
| 2008/0138514 A1 | 6/2008 | Jang et al. |

(Continued)

FOREIGN PATENT DOCUMENTS

| | | |
|---|---|---|
| EP | 1337695 B1 | 12/2010 |
| KR | 1020120098799 A | 9/2012 |
| WO | 2006065054 A1 | 6/2006 |
| WO | 2009127857 | * 10/2009 |
| WO | 2009127857 A1 | 10/2009 |
| WO | 2011008064 A9 | 1/2011 |
| WO | 2012177793 A1 | 12/2012 |
| WO | 2013078245 A1 | 5/2013 |

OTHER PUBLICATIONS

Abstract of WO 2015/075929. May 28, 2015.*

(Continued)

*Primary Examiner* — Sheng H Davis
(74) *Attorney, Agent, or Firm* — Hodgson Russ LLP

(57) ABSTRACT

A method for synthesizing a metal chalcogenide nanocrystal (NC) material includes reacting a metal material and an ammonium chalcogenide material in an organic solvent material. The method provides that the metal chalcogenide nanocrystal material may be synthesized by a heating-up method at large scale (i.e., greater than 30 grams). Ammonium chalcogenide salts exhibit high reactivity and metal chalcogenide nanocrystals can be synthesized at low temperatures (i.e., less than 200° C.) with high conversion yields (i.e., greater than 90 percent).

18 Claims, 7 Drawing Sheets

(56) References Cited

U.S. PATENT DOCUMENTS

| | | | |
|---|---|---|---|
| 2009/0223410 A1* | 9/2009 | Jun .......................... | B22F 9/24 |
| | | | 106/31.92 |
| 2010/0072434 A1* | 3/2010 | Lee ......................... | B22F 1/025 |
| | | | 255/514 |
| 2010/0298123 A1* | 11/2010 | Shen ...................... | B82Y 30/00 |
| | | | 502/172 |
| 2012/0129322 A1 | 5/2012 | Meissner et al. | |
| 2012/0205597 A1 | 8/2012 | Manoharan | |
| 2012/0280185 A1 | 11/2012 | Liao | |
| 2013/0037111 A1 | 2/2013 | Mitzi et al. | |
| 2013/0040143 A1 | 2/2013 | Asokan et al. | |

OTHER PUBLICATIONS

Zhang, Z. et al. "A Simple Way to Prepare PbS . . . " J. Phys. Chem. 110, 6649-6654 (2006).*
International Search Report and Written Opinion Form PCT/ISA/220, International No. PCT/US2013/058676, pp. 1-12, International Filing Date Sep. 9, 2013.

* cited by examiner

METAL CHALCOGENIDE SYNTHESIS METHOD AND APPLICATIONS

CROSS-REFERENCE TO RELATED APPLICATION

This application is related to, and derives priority from, U.S. Provisional Patent Application Ser. No. 61/698,066, filed 7 Sep. 2012 and titled Metal Chalcogenide Nanocrystal Materials, Methods and Applications, the content of which is incorporated herein fully by reference.

STATEMENT OF GOVERNMENT INTEREST

The research that lead to the embodiments as described herein and the invention as claimed herein was funded by: (1) the United States National Science Foundation under grant number CHE-1152922 and grant number DMR-1120296; and (2) the United States Department of Energy under grant number DE-SC0001086. The United States Government has rights in the invention as claimed herein.

BACKGROUND

Field of the Invention

Embodiments relate generally to metal chalcogenide nanocrystal (NC) synthesis methods. More particularly embodiments relate to large scale (i.e., greater than about 30 grams), high yield (i.e., at least about 90 percent yield) metal chalcogenide nanocrystal (NC) synthesis methods.

Description of the Related Art

Substantial efforts have been expended on the synthesis of metal chalcogenide nanocrystal (NC) materials in the last 30 years due to their size-tunable optical properties and potential suitability in many technological applications, including but not limited to light-emitting diode, photovoltaic device and fluorescent biological label applications.

Since metal chalcogenide nanocrystal (NC) materials are clearly desirable due to their applications in many diverse technical fields, desirable are novel methods for synthesizing metal chalcogenide nanocrystal (NC) materials.

SUMMARY

In a most general sense, the embodiments provide that a reaction between an ammonium chalcogenide material and a metal material in an organic solvent material provides a synthetic pathway to a metal chalcogenide nanocrystal (NC) material. The foregoing reaction may be undertaken within an anhydrous organic solvent material with the addition of an appropriate surfactant material to provide the resulting metal chalcogenide nanocrystal (NC) material with a particularly monodisperse characteristic (i.e., having a nanoparticle size distribution less than 10%).

The embodiments also contemplate use of an organic anhydrous nonpolar solvent material when synthesizing the metal chalcogenide NC material within the context of the reaction described above. The use of the organic anhydrous non-polar solvent material is desirable insofar as the use of a non-polar solvent material minimizes solvent effects with respect to a surfactant which is otherwise also generally a polar material.

The embodiments also contemplate use of an organic solvent material when synthesizing the metal chalcogenide NC material by a reaction between an ammonium chalcogenide material and a metal material. The use of the organic solvent material is desirable insofar as an organic solvent in colloidal NC synthesis provides for a better size and quality control.

The embodiments also contemplate, and in particular demonstrate, the synthesis of metal chalcogenide NC materials in large scale (>30 g) and high yield (>90%) by a heat-up method, which large scale and high yield is not presently realized using other synthetic methods.

The embodiments also contemplate, and in particular demonstrate, the synthesis of particular NC materials in particular desirable size ranges not easily presently realized using other synthetic methods. In that regard, the embodiments demonstrate a nanoparticle comprising at least one of a $Bi_2S_3$ material composition (3-5 nm) and an $Ag_2S$ material composition (2-3 nm). The embodiments also demonstrate a nanoparticle comprising a SnS material composition and having a sub-10 nm size dimension (i.e., a range from about 6 to about 10 nanometers). In general, the embodiments contemplate NC material size ranges from about 1 to about 10 nanometers, although larger size ranges are not excluded (i.e., from about 1 to about 20 nanometers, or alternatively from about 1 to about 50 nanometers).

A particular method in accordance with the embodiments includes reacting in an organic solvent material a metal material and an ammonium chalcogenide material to form a metal chalcogenide nanocrystal material.

Another particular method in accordance with the embodiments includes reacting in an anhydrous organic solvent material at a temperature less than 100 degrees centigrade a metal material and an ammonium chalcogenide material to form a metal chalcogenide nanocrystal material.

BRIEF DESCRIPTION OF THE DRAWINGS

The objects features and advantages of the embodiments are understood within the context of the Detailed Description of the Non-Limiting Embodiments, as set forth below. The Detailed Description of the Non-Limiting Embodiments is understood within the context of the accompanying drawings, that form a material part of this disclosure, wherein.

d) Demonstration of ultra-large scale synthesis of $Cu_2S$ NCs obtained from a single reaction. e-f): TEM images demonstrating size control for SnS NCs: e, 70° C., 6±0.5 nm; f, 80° C., 7.5±0.5 nm. g): TEM image of ZnS NCs (5.5±0.4 nm). h): TEM image of MnS NCs (20×12 nm). The scale bars represent 50 nm.

Figure 5:
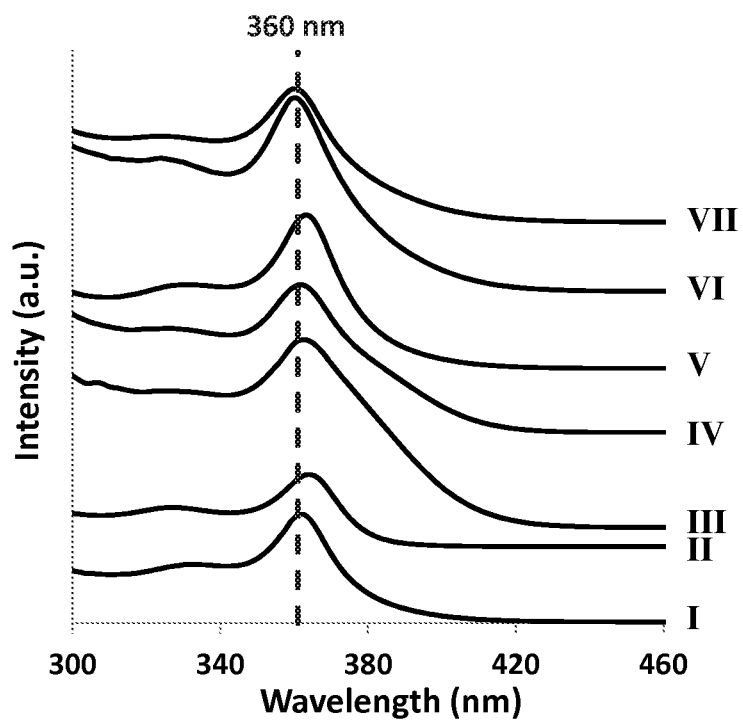

FIG. 5 shows: Optical absorption spectra of CdS NCs synthesized by reacting $(NH_4)_2S$ and $Cd(OA)_2$ at molar ratio of 1:1 under different conditions. I is the standard condition for the synthesis of CdS-1. II-VII are different conditions. Compared to the conditions of I, the modified parts in II-VII are as following: II, synthesis temperature was increased to 60° C.; III, ODE was replaced by octyl ether; IV, 50% of oleic acid was replaced by the same molar amount of nonanoic acid; V, TOP was added as co-surfactant at the amount of 2 mL TOP per mmol of $Cd(OA)_2$; VI, the amount of oleic acid was doubled; VII, ODE was replaced by trioctylphosphine oxide (TOPO), and the reaction temperature was increased to 60° C. I-VII produced the CdS NCs with the similar band gap absorption at ca. 360 nm. This data demonstrates the robustness of the synthesis, producing CdS NCs with ~360 nm absorption peaks despite variations of solvents and ligands.

Figure 6:
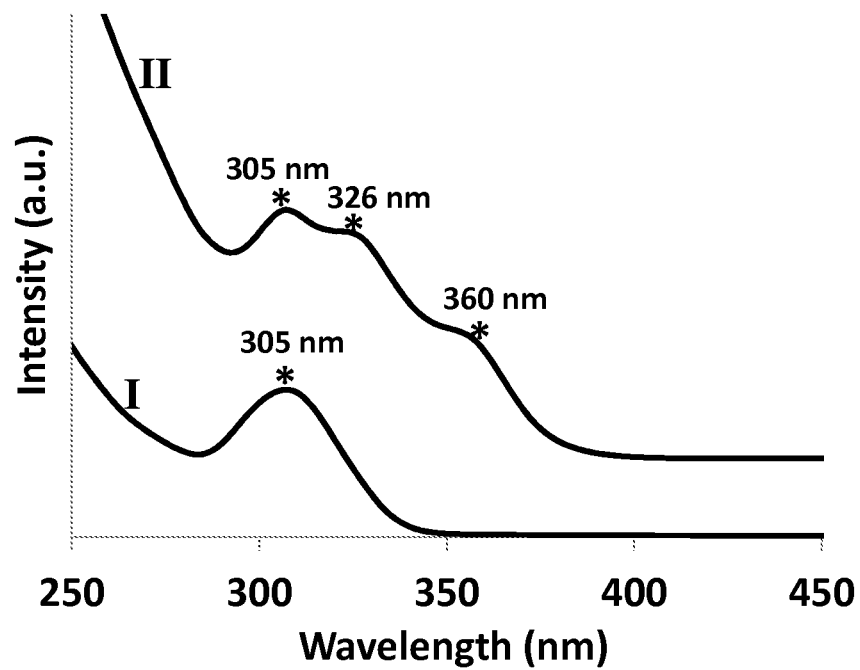

FIG. 6 shows: Optical absorption spectra of CdS NCs synthesized by reacting $(NH_4)_2S$ and $Cd(OA)_2$ at room temperature with $Cd(OA)_2:(NH_4)_2S$ ratios of 8.3:1 (I) and 2:1 (II).

Figure 7:
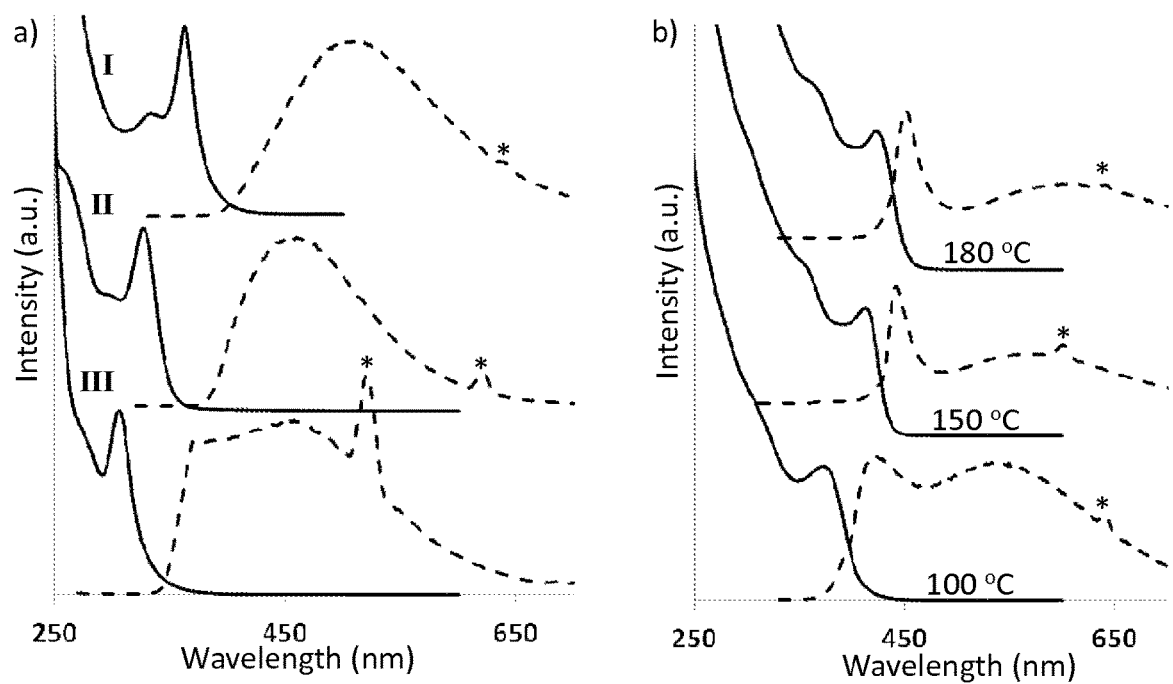

FIG. 7 shows: Optical absorption (solid) and photoluminescence (PL, dashed) spectra of CdS NCs. a) CdS NCs synthesized at room temperature: CdS-1 (I), CdS-2 (II), and CdS-3 (III). b) CdS NCs synthesized at higher temperatures. Peaks marked with * in PL spectra are from excitation lamp.

Figure 8:
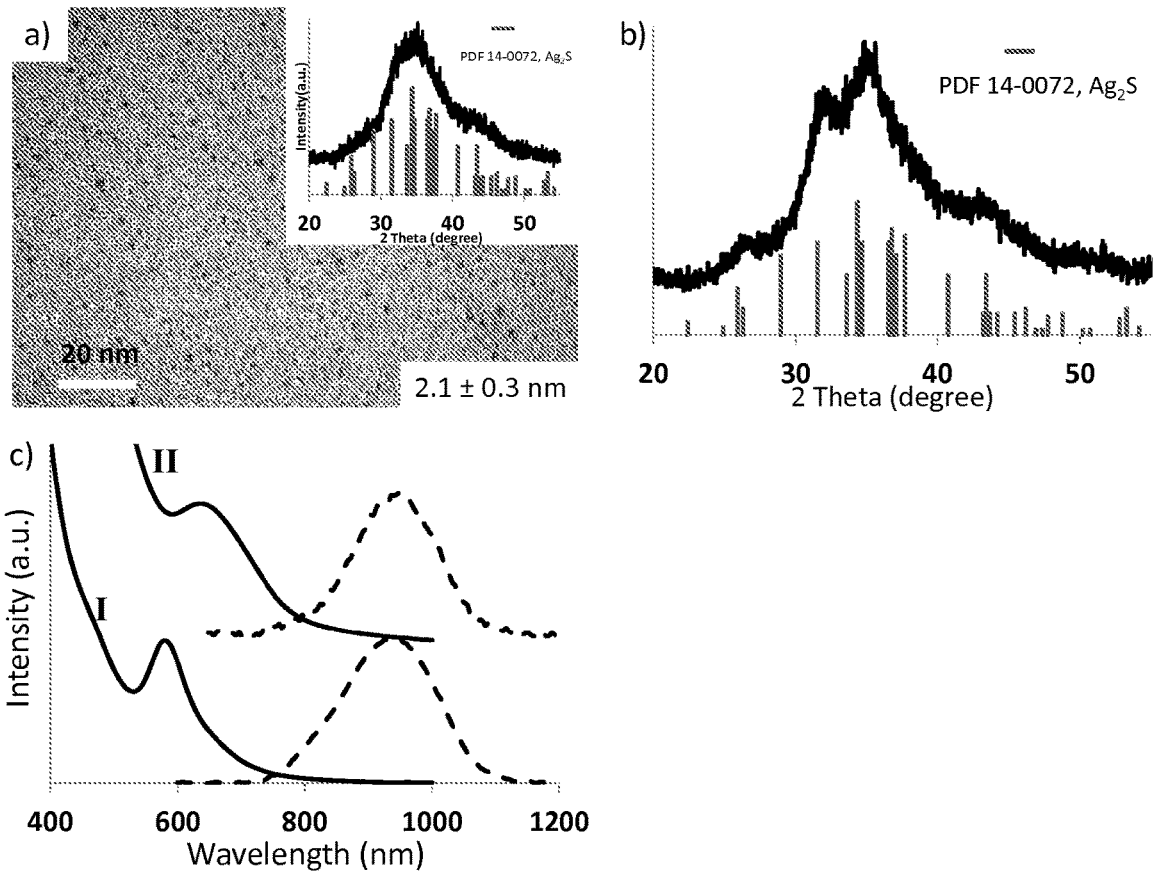

FIG. 8 shows: a) TEM image of $Ag_2S$-1 NCs (2.1±0.3 nm). Inset of a shows XRD pattern of $Ag_2S$-1. b) XRD pattern of $Ag_2S$-2. c) Optical absorption (solid) and photoluminescence (PL, dashed) spectra of $Ag_2S$-1 (I) and $Ag_2S$-2 (II).

Figure 9:
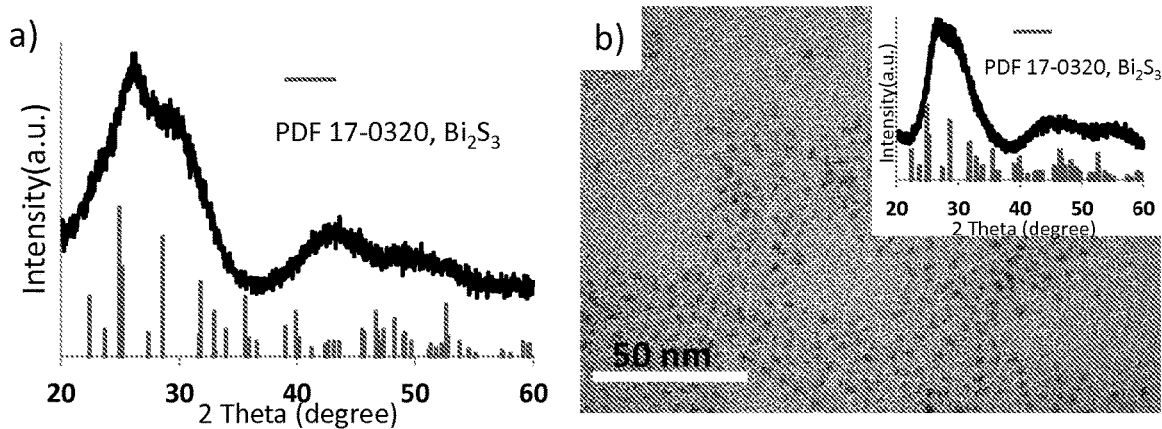

FIG. 9 shows: a) XRD pattern of $Bi_2S_3$-1 NCs. b) TEM image of $Bi_2S_3$-2 NCs (3.3±0.4 nm). Inset of b shows XRD pattern of $Bi_2S_3$-2.

Figure 10:
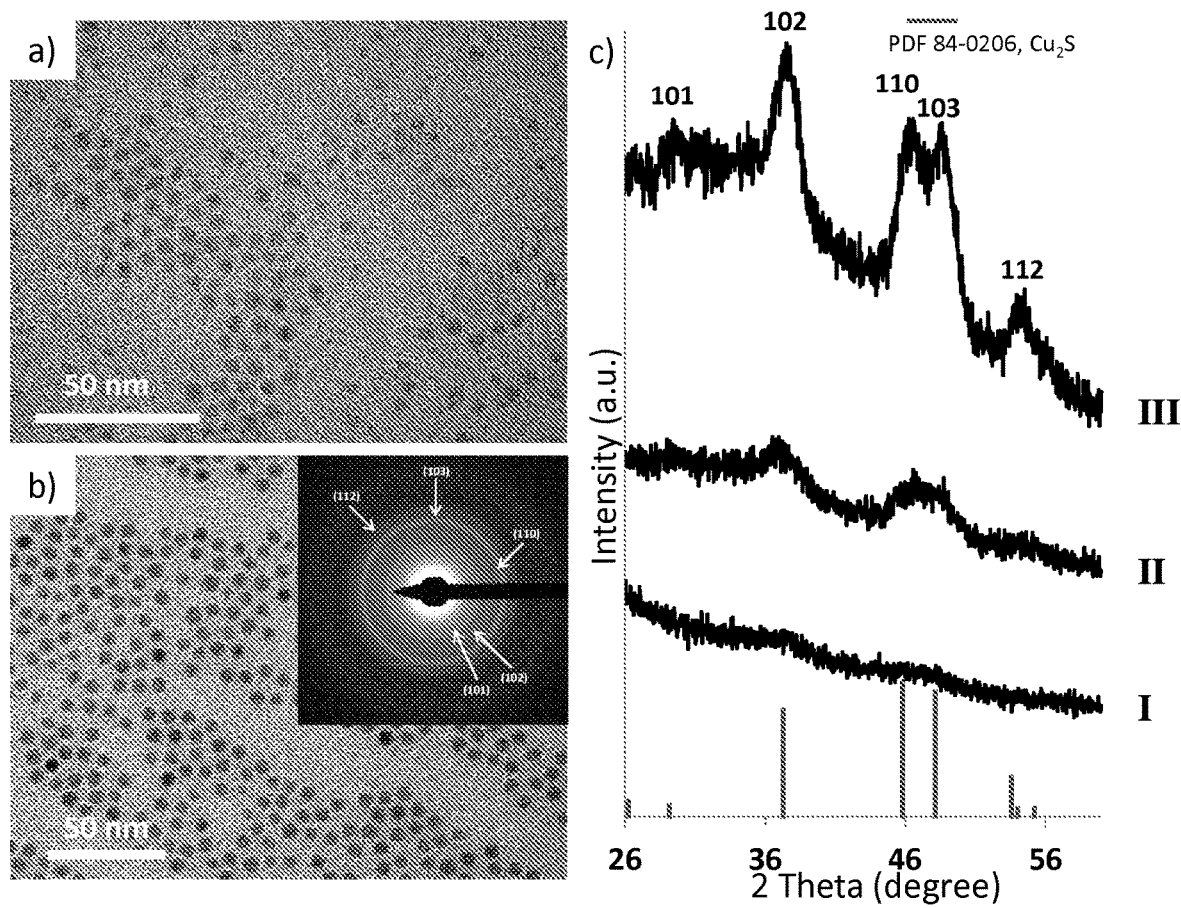

FIG. 10 shows: a) TEM image of $Cu_2S$ NCs (ca. 4.5 nm) synthesized at 50° C. b) TEM image of monodisperse $Cu_2S$ NCs (6.5±0.4 nm) synthesized at 180° C. with a large scale (ca. 39 g $Cu_2S$ NCs are produced in a single reaction. See FIG. 4d). Inset of b shows electron diffraction (ED) pattern of $Cu_2S$ NCs. c) XRD pattern of $Cu_2S$ NCs synthesized at different temperatures: I, 50° C.; II, 120° C.; III, 180° C.

Figure 11:
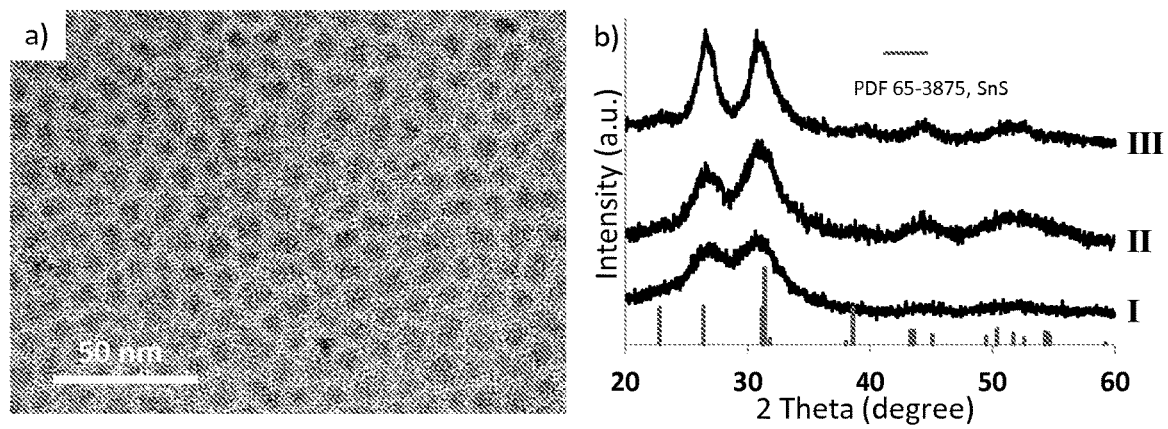

FIG. 11 shows. a) TEM image of SnS NCs (ca. 10.5±1 nm) synthesized at 105° C. b) XRD pattern of SnS NCs synthesized at different temperatures: I, 70° C.; II, 80° C.; III, 105° C.

Figure 12:
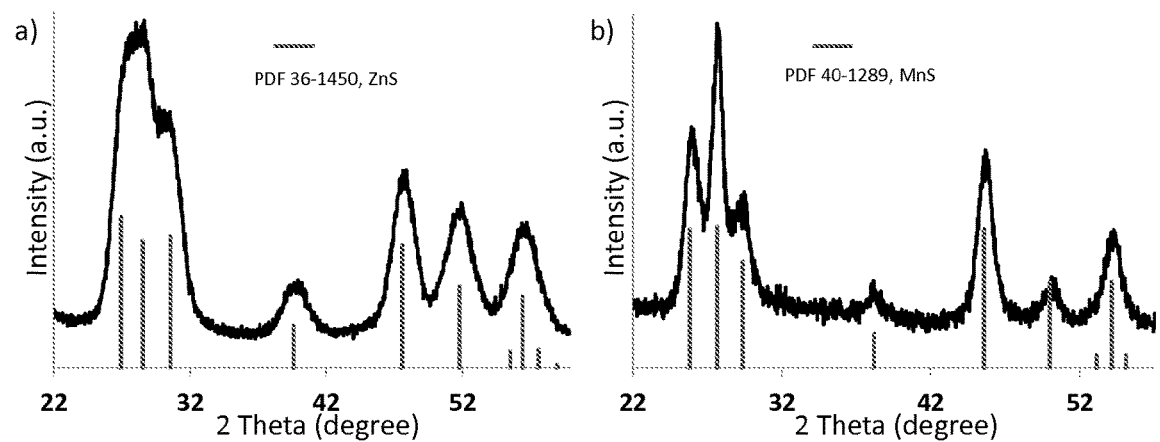

FIG. 12 shows: a). XRD pattern of ZnS NCs synthesized by reacting $(NH_4)_2S$ and $ZnCl_2$ at 320° C. b) XRD pattern of MnS NCs synthesized by reacting $(NH_4)_2S$ and $MnCl_2$ at 250° C.

DETAILED DESCRIPTION OF THE NON-LIMITING EMBODIMENTS

1. General Considerations

Broadly, the embodiments provide a relatively low temperature (i.e., less than about 200 degrees centigrade) method for synthesizing a metal chalcogenide NC material by reacting an ammonium chalcogenide material and a metal material in an organic solvent material. The method in accordance with the embodiments may employ as the ammonium chalcogenide material at least one of ammonium sulfide, ammonium selenide and ammonium telluride (i.e., each of the foregoing intended as the diammonium compound). The method in accordance with the embodiments may also employ as a metal material at least one of a metal oxide, a metal coordination complex and a metal salt. The at least one of the metal oxide, the metal coordination complex and the metal salt may comprise a (nominal (i.e., within a metal oxide) or actual) metal cation selected from the group including but not limited to Ti, Mn, Fe, Co, Ni, Cu, Zn, Ga, Mo, Ag, Cd, In, Sn, Sb, W, Hg, Pb, and Bi metal cations, in any of several oxidation states. In particular with respect to a metal salt, a metal salt may also comprise an anion selected from the group including but not limited to carboxylate, diketonate, halide, perchlorate and amide anions.

With respect to a solvent material in accordance with the embodiments, a solvent material is preferably an anhydrous organic coordinating or non-coordinating solvent material. The embodiments that follow use octadecene and oleylamine as such an anhydrous organic solvent material, however the embodiments are not intended to be so limited. Alternative anhydrous organic solvent materials may also include, but are not necessarily limited to octane, octyl ether, diphenyl ether, trioctylphosphine oxide, trioctylphosphine, dichlorobenzene and trichlorobenzene.

Also considered within the context of the embodiments is the inclusion within the solvent material of a surfactant material that may be helpful in controlling NC growth. Within the context of the examples that follow oleic acid and oleyl amine may at least in part serve the purpose of such a surfactant material. However other surfactant materials (which may serve as solvent materials) may also be used, including but not limited to dodecanethiol, trioctylphosphine oxide, alkylphosphines including but not limited to trioctylphosphine and tributylphosphine, octadecylphosphonic acid and tetradecylphosphonic acid.

A synthetic reaction for synthesizing a metal chalcogenide nanocrystal material in accordance with the embodiments may be undertaken at a temperature less than about 200 degrees centigrade, more preferably less than about 150 degrees centigrade, more preferably less than about 100 degrees centigrade and most preferably less than about 50 degrees centigrade. Due to the high reactivity of ammonium chalcogenides, some synthetic reactions may be undertaken at a temperature less than 50 degrees centigrade, which can be used to synthesize small size NCs that cannot be produced by conventional high temperature methods. Small size NCs in accordance with the embodiments may be produced with a size distribution of less than 15% and preferably less than 10%. Such a monodispersity of the size distribution is determined by TEM measurement, and using otherwise conventional calculation methodology.

Within the context of the embodiments when the desired metal chalcogenide is a metal sulfide, the stoichiometric reaction between $(NH_4)_2S$ and a metal material affords a rational synthetic method to a metal sulfide material. Such a reaction follows a clear mechanism without complicated redox reactions which may be involved in more conventional metal sulfide NC synthesis reactions that use an elemental sulfur as a sulfur source material. A nanocrystal synthesis method in accordance with the embodiments may be used to provide a variety of monodisperse metal sulfide colloidal NCs, including but not limited to CdS, $Ag_2S$, $Bi_2S_3$, $Cu_2S$, SnS, ZnS, and MnS. The stoichiometric reaction between $(NH_4)_2S$ and a metal salt in accordance with the embodiments results in a metal sulfide NC with a high conversion yield, and the synthesis can produce more than 30 g of monodisperse NC material in a single reaction in a single bulk reactor. (NH$_4$)$_2$S exhibits very high reactivity at relatively low temperatures, which opens a new way to synthesize small size NC materials that are difficult to obtain by the conventional high temperature methods, such as Ag$_2$S and Bi$_2$S$_3$ quantum dots.

2. Specific Examples and Embodiments

Figure 1:
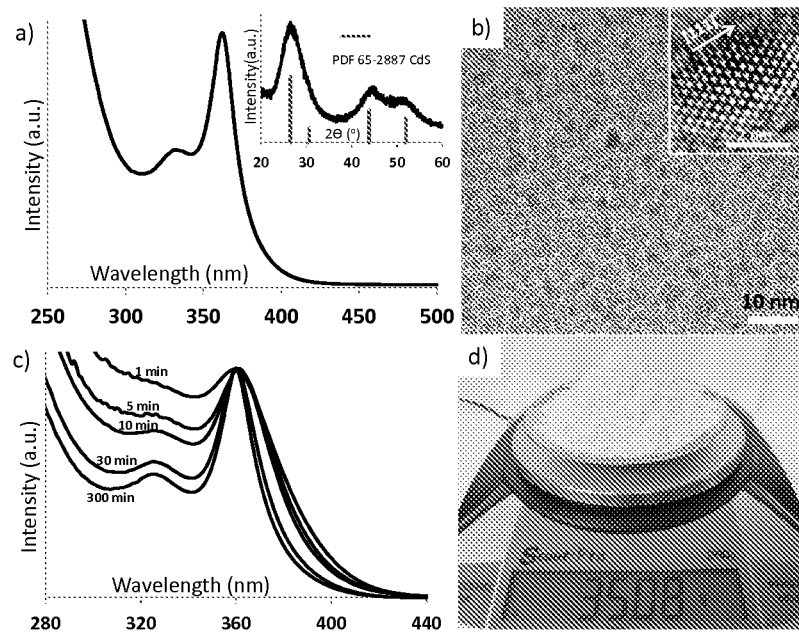
FIG. 1 shows: a) Optical absorption spectrum of CdS-1. Inset of a shows XRD pattern of CdS-1. b) HR-TEM image of CdS-1. The crystalline lattice in inset of b corresponds to (111) facet of cubic CdS phase. c) Optical absorption spectra evolution in the synthesis of CdS-1. d) Demonstration of ultra-large scale synthesis of CdS-1 obtained from a single reaction: 35 grams of product.

A sulfide precursor solution was prepared by dissolving commercially available (NH$_4$)$_2$S aqueous solution into a primary amine solvent, such as oleylamine. H$_2$O was then removed by freshly activated 3 Å molecular sieves. The anhydrous (NH$_4$)$_2$S oleylamine solution exhibited good stability and could be kept for more than 1 hour while maintaining a similar reactivity. This (NH$_4$)$_2$S oleylamine solution was highly reactive towards a variety of metal salts, and metal sulfide NCs were synthesized in the presence of appropriate surfactants. In the case of CdS NC synthesis, (NH$_4$)$_2$S reacted with Cd(OA)$_2$ (molar ratio of 1:1) in octadecene (ODE) at room temperature and produced NCs (CdS-1) with a sharp band gap absorption peak at ca. 360 nm (full width at half maximum (fwhm)=15 nm; FIG. 1a), which suggested a NC size of ca. 2.5 nm. The synthesis was carried out in air by simply combining (NH$_4$)$_2$S and Cd(OA)$_2$ solutions together in a capped vial. The reaction was easily scaled up (FIG. 1d), and has a conversion yield of over 90%. HRTEM studies (FIG. 1b) showed that the NCs had an elongated quasi-spherical shape (ca. 3×2.5 nm) with high crystallinity. The lattice value of 3.2 Å agreed with the characteristic d-spacing for the (111) plane of bulk cubic CdS.

An aliquots study showed that a room temperature reaction of (NH$_4$)$_2$S and Cd(OA)$_2$ (at molar ratio 1:1) initially produced CdS NCs with band gap absorption of 360 nm and a broad fwhm, and then the CdS NCs exhibited a size self-focusing process with the fwhm decreasing from ca. 50 nm to ca. 15 nm in 30 minutes (FIG. 1c). The initially formed (in ca. 1 min) NC product did not show further growth and its band gap absorption remained at 360 nm during a 5 hour reaction. This reaction was highly stable for a variety of synthetic parameters (FIG. 5), producing CdS NCs with ca. 360 nm bandgap absorption in both non-polar (e.g. ODE) and polar (e.g. octyl ether, TOPO) solvents, using various surfactant ligands (e.g. oleic acid, trioctylphosphine (TOP)), different cadmium complexes, and even at slightly higher temperatures (60° C.). Such small and extremely size-stable NCs have been reported for II-VI semiconductor NCs, called magic-size NCs (MSNs).

The room temperature reactions of (NH$_4$)$_2$S with Cd(OA)$_2$ produced different size CdS NCs by varying the Cd(OA)$_2$ to (NH$_4$)$_2$S ratios. Monodisperse CdS NCs with bandgap absorption at 326 nm (CdS-2) and 305 nm (CdS-3) (FIG. 2a; suggesting NC sizes of 1.3 nm and 0.9 nm, respectively) were synthesized in pure form by the reaction of Cd(OA)$_2$ and (NH$_4$)$_2$S at molar ratios of 2.8:1 and 4.2:1, respectively. A higher Cd(OA)$_2$ to (NH$_4$)$_2$S ratio formed smaller CdS NCs. However, the size of CdS NCs could not be continuously changed for a room temperature reaction: an increase of the Cd(OA)$_2$ to (NH$_4$)$_2$S ratio to 8.3:1 still produced NCs with the same size of CdS-3, while an intermediate Cd(OA)$_2$ to (NH$_4$)$_2$S ratio (2:1) resulted in a mixture of products of CdS-1, CdS-2 and CdS-3 (FIG. 6). Such a discontinuous stepwise growth was observed in the other MSNs synthesis, in which the NCs had a number of thermodynamically stable configurations and, instead of continuous growth, their sizes jumped from one configuration to the next one.

Figure 2:
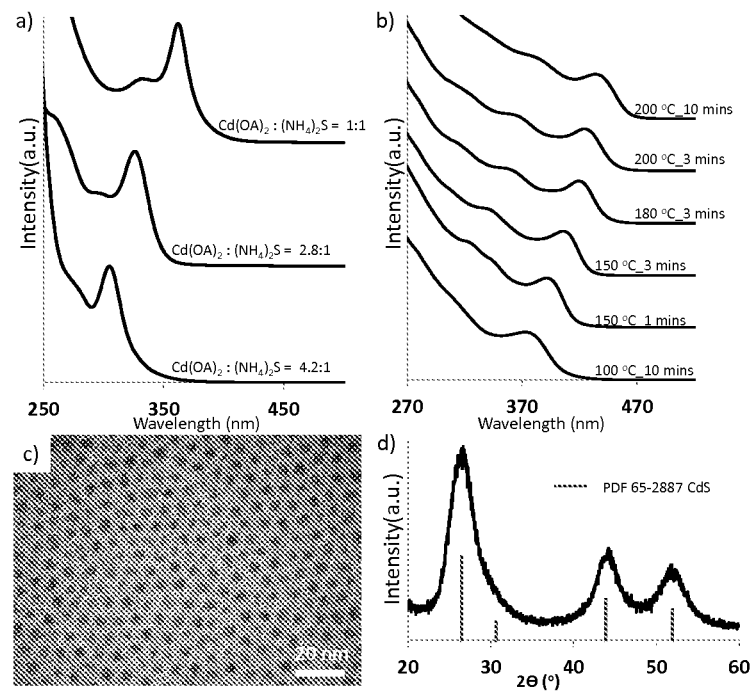
FIG. 2 shows: a) Optical absorption spectra of CdS NCs (CdS-1, CdS-2, and CdS-3) synthesized at room temperature using different $Cd(OA)_2:(NH_4)_2S$ ratios. b) Optical absorption spectra of CdS NCs synthesized by reacting $Cd(OA)_2$ and $(NH_4)_2S$ between 100-200° C. c) TEM image of CdS NCs (4.9±0.4 nm) synthesized by reacting $Cd(OA)_2$ and $(NH_4)_2S$ at 200° C. for 10 minutes. d) Powder XRD pattern of 4.9±0.4 nm CdS NCs.

The continuous growth of larger size CdS NCs was achieved by raising the reaction temperature over 100° C. FIG. 2b shows the UV-vis absorption spectra of CdS NCs synthesized between 100-200° C. using the reaction of Cd(OA)$_2$ and (NH$_4$)$_2$S in ODE. All spectra exhibited sharp band gap absorption features, indicating the formation of nearly monodisperse CdS NCs. TEM images revealed a near-spherical NC shape and XRD studies confirmed the cubic CdS phase (FIG. 2c,d). The size of CdS NCs was tuned between 3 nm to 5 nm, with longer reaction times and higher reaction temperatures favoring the formation of larger nanocrystals.

The photoluminescence (PL) of CdS NCs is summarized in FIG. 7. The PL spectra (FIG. 7a) of room temperature synthesized NCs (CdS-1, CdS-2, and CdS-3) featured broad peaks centered around 450-500 nm with no bandgap emission being observed. A similar fluorescence was reported for CdS MSNs and was explained as trap state emissions. A high surface to volume ratio and lack of high temperature annealing might be two major factors that cause the trap state emissions of the embodied synthesized CdS NCs. In contrast, the CdS NCs obtained at higher temperatures exhibited clear bandgap emission and the trap state emission was significantly depressed by increasing reaction temperature (FIG. 7b). Sharp bandgap emission dominated the fluorescence of CdS NCs for synthetic temperatures over 150° C.

Figure 3:
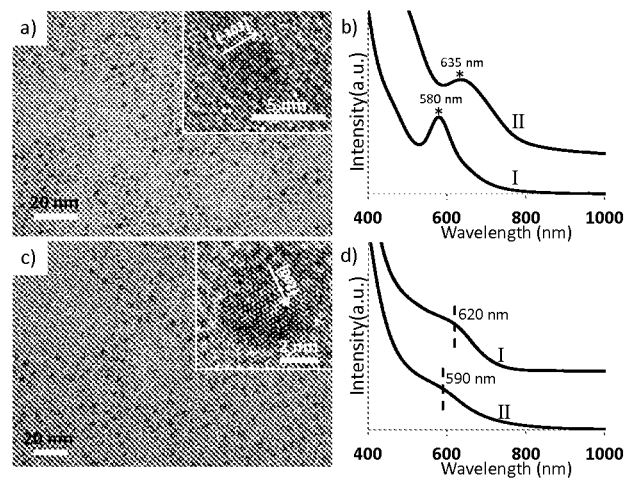
FIG. 3 shows: a) TEM image of $Ag_2S$-2 NCs (2.8±0.4 nm). The crystalline lattice of $Ag_2S$-2 in inset a corresponds to the (−103) facet. b) Optical absorption spectra of $Ag_2S$-1 (I) and $Ag_2S$-2 (II). c) TEM image of $Bi_2S_3$-1 NCs (4.5±0.5 nm). The crystalline lattice of $Bi_2S_3$-1 in inset c corresponds to (002) facet. d) Optical absorption spectra of $Bi_2S_3$-1 (I) and $Bi_2S_3$-2 (II).

The embodied highly thermodynamically favored, low-temperature synthetic technique provides a novel method to produce small size metal sulfide quantum dots, some of which are difficult to be obtained by the conventional high temperature reactions. For example, the synthesis of Ag$_2$S NCs within the quantum confinement regime remains difficult and only a very few examples are known. In contrast, the embodiments provide that small size Ag$_2$S quantum dots can be obtained by reacting (NH$_4$)$_2$S with AgCl in a solvent mixture of oleylamine and TOP at room temperature. XRD results of as-prepared Ag$_2$S NCs showed broad peaks which were consistent with the pattern of monoclinic α-Ag$_2$S (PDF 14-0072; FIG. 8a,b). HRTEM studies revealed the lattice with d-spacing of 2.4 Å, which can be indexed as the (−103) facet of monoclinic α-Ag$_2$S (inset of FIG. 3a). Inductively coupled plasma mass spectrometry (ICP-MS) studies also confirmed that NC products consistent of Ag and S elements with the atomic ratio of Ag:S equaling to 2.8:1. Similar with CdS MSNs synthesis, the size of Ag$_2$S NCs could be tuned discontinuously by varying AgCl:(NH$_4$)$_2$S ratios: Ag$_2$S NCs with average sizes of ca. 2.1 nm (Ag$_2$S-1; FIG. 8a) and 2.8 nm (Ag$_2$S-2; FIG. 3a) were obtained by using AgCl:(NH$_4$)$_2$S ratios of 16:1, and 8:1 respectively. Ag$_2$S-1 NCs exhibited clear excitonic absorption peaks at 580 nm, while this peak red-shifted to 635 nm for the bigger size Ag$_2$S-2 NCs (FIG. 3b). Compared to the band-gap energy of bulk α-Ag$_2$S (0.9-1.1 eV), these excitonic absorption peaks of Ag$_2$S-1 and Ag$_2$S-2 showed significant blue shifts, indicating that the embodied Ag$_2$S NCs products behave within a quantum-confinement regime. The photoluminescence (PL) of Ag$_2$S-1 and Ag$_2$S-2 featured NIR emission centered at 940 nm, with symmetric emission peaks (FIG. 8c). These NIR emissions could not be tuned by changing the size of NCs, indicating that they were likely caused by surface trap states.

The embodied method was also used to produce Bi$_2$S$_3$ quantum dots. Although Bi$_2$S$_3$ NCs with different morphologies have been well studied, quantum confinement in Bi$_2$S$_3$ NCs has previously only been observed in very limited examples. A room temperature reaction of (NH$_4$)$_2$S and bismuth dodecanethiolate complex produced uniform Bi$_2$S$_3$ NCs, with an average size of ca. 4.5 nm (Bi$_2$S$_3$-1; FIG. 3c). The XRD spectrum of Bi$_2$S$_3$-1 closely resembled the pattern reported for ultrathin Bi$_2$S$_3$ necklace nanowires, and the broadened peaks can be assigned to orthorhombic $Bi_2S_3$ (PDF 17-0320; FIG. 9a). The HRTEM image in FIG. 3c shows a lattice with d-spacing of 1.98 Å, which can be indexed to (002) facet of orthorhombic $Bi_2S_3$. The UV-vis absorption spectrum of $Bi_2S_3$-1 NCs displays a clear shoulder near the onset of absorption at ca. 620 nm (I of FIG. 3d), which is similar to the absorption spectrum of reported quantum confined $Bi_2S_3$ necklace NCs and can be ascribed to the lowest-energy excitonic absorption. Relative to the bandgap energy of orthorhombic bulk $Bi_2S_3$ (1.3 eV), the excitonic absorption of this $Bi_2S_3$ NC had a 0.7 eV blue shift as a consequence of quantum confinement. The size of $Bi_2S_3$ NCs was tuned by using different bismuth complex precursors in synthesis.

The reaction of $Bi(OA)_3$ and $(NH_4)_2S$ at 60° C. afforded $Bi_2S_3$ NCs of ca. 3.3 nm ($Bi_2S_3$-2; FIG. 9b). XRD studies of as-prepared $Bi_2S_3$-2 revealed a similar pattern as that of $Bi_2S_3$-1(inset of FIG. 9b). The exitonic absorption of the smaller $Bi_2S_3$-2 particle is at ca. 590 nm (II of FIG. 3d), displaying a clear blue shift compared to the bigger $Bi_2S_3$-1 NCs.

Figure 4:
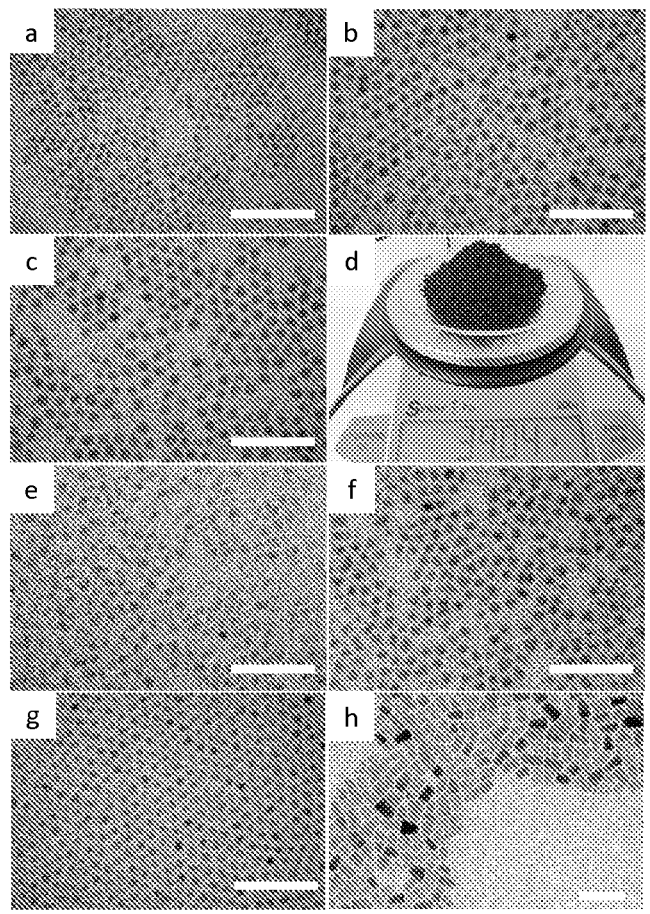
FIG. 4 shows: a-c) TEM images of $Cu_2S$ NCs synthesized at different temperatures with different sizes: a, 120° C., 4.6±0.3 nm; b, 180° C., 6.4±0.4 nm; c, 200° C., 7.4±0.4 nm.

The embodied methodology is widely applicable for the synthesis of other monodisperse metal sulfide NCs, such as $Cu_2S$, SnS, ZnS, and MnS. The near-room temperature (50° C.) reaction of CuCl and $(NH_4)_2S$ produced ca. 4.5 nm spherical NCs with weak crystallinity (FIG. 10a). ICP-MS studies on this NCs sample revealed a Cu:S of 2.4:1, close to a stoichiometry of $Cu_2S$. Heating up the reaction solution increased the crystallinity (FIG. 10c) as well as the NCs size. Monodisperse $Cu_2S$ NCs with tunable size (4.6 to 7.4 nm; FIG. 4a-c) were synthesized by this heating-up process with conversion yield of over 85%. The reaction was carried out at ultra-large scales and more than 30 g of monodisperse $Cu_2S$ NCs could be produced in a single reaction without a size-sorting process (FIG. 4d, FIG. 10b). For SnS, monodisperse colloidal NCs were synthesized by adding $(NH_4)_2S$ to $Sn(OA)_2$ ODE solution at different temperatures. XRD studies showed an orthorhombic SnS phase (PDF 65-3875; FIG. 11b), and the size of nanoparticles could be tuned between 6 nm to 10.5 nm under relatively low reaction temperatures (70° C. to 105° C.; FIG. 4e,f and FIG. 11a). The embodiments suggest that $(NH_4)_2S$ can be used in high temperature hot-injection reactions: spherical Wurtzite ZnS nanocrystals (5.5 nm) were obtained by adding $(NH_4)_2S$ into a $ZnCl_2$ oleylamine/TOP solution at 320° C. (FIG. 4g, FIG. 12a), while injection of $(NH_4)_2S$ into $MnCl_2$ oleylamine/oleic acid solution at 250° C. resulted in rod-shaped MnS nanocrystals with average size of ca. 20×12 nm (FIG. 4h, FIG. 12b). Based on metal precursors, the conversion yields could be over 90% when excess $(NH_4)_2S$ (i.e., molar ratio of $(NH_4)_2S$:metal precursor=2) are loaded in these high temperature hot-injection synthesis.

In conclusion, the embodiments report the use of $(NH_4)_2S$ as a generic sulfide precursor in organic nonpolar-phase nanocrystals synthesis. This method offers rational syntheses to a variety of monodisperse metal sulfide NCs. Compared to conventional methods, the simple and clear reaction mechanism of the embodiments may bring important advantages, such as good reproducibility, high conversion yields, and ultra-large scale production of monodisperse NCs. This will benefit the applications of semiconductor colloidal nanocrystals in high-tech devices that need copious amount of materials. Moreover, $(NH_4)_2S$ exhibits very high reactivity toward metal complexes and the synthesis in general can be performed at low temperatures, which opens new opportunities for producing metal sulfide NCs which are difficult to be obtained by the conventional higher temperature (i.e., greater than about 200 degrees centigrade) methods.

3. Experimental 3.1 General Procedures

All of the manipulations were carried out in a dry, oxygen-free, dinitrogen atmosphere by employing standard Schlenk line and glove box techniques unless otherwise noted. Hexanes (≥98.5%), ethanol (≥99.5%), 1-octadecene (90%), octyl ether (99%), oleic acid (90%), 1-dodecanethiol (98%), ammonium sulfide (40-48 wt % solution in water), oleylamine (70%), trioctylphosphine oxide (TOPO, 99%), cadmium oxide (99.99%), silver chloride (99.999%), bismuth acetate (99.99%), copper(I) chloride (99.995%), tin(II) acetate, manganese (II) chloride (99.999%), zinc chloride (99.999%), and lead nitrate (99%) were purchased from Aldrich; molecular sieves (UOP type 3 Å) were purchased from Aldrich and activated at 300° C. under dynamic vacuum for 3 hours before use; triphenyl bismuth (99%) was purchased from Alfa Aesar; trioctylphosphine (TOP, 97%) was purchased from Strem.

The conventional transmission electron microscopy (TEM) images were recorded on an FEI Tecnai T12 transmission electron microscope operating at 120 kV; the high-resolution TEM (HRTEM) images were collected on an FEI Tecnai F20 transmission electron microscope operating at 200 kV. Samples for TEM analysis were prepared by putting a drop of solution containing nanoparticles on the surface of a copper grid coated with an amorphous carbon film. X-ray powder diffraction data were collected on a Scintag Theta-Theta X-ray diffractometer (Cu Kα radiation). UV-vis absorption data were collected on a Shimadzu UV-3101PC spectrometer. The photoluminescence spectra of CdS NCs were measured by using visible PTI (Photon Technology International, Inc) fluorometer with mercury lamp as an excitation source, and GaAs photomultiplier tube (PMT). The photoluminescence spectra of $Ag_2S$ NCs were recorded at room temperature with a visible fluorometer equipped with a 200 mm focal length monochromator, a 25 mW Ar+ ion laser as the excitation source, and a Si photodiode. Elemental analysis (Inductively coupled plasma mass spectrometry (ICP-MS)) was performed at ALS Environmental, Tucson, Ariz.

3.2 Determining the Concentration of Commercially Available $(NH_4)_2S$ Solution The commercially available $(NH_4)_2S$ aqueous solution had a concentration of ca. 40-48 wt %. The actual concentration was determined by reacting $(NH_4)_2S$ solution with $Pb(NO_3)_2$: 400 μL $(NH_4)_2S$ was added to 0.3 g/mL $Pb(NO_3)_2$ $H_2O$ solution (10 mL; $Pb(NO_3)_2$ was ca. 3.5 fold excess than $(NH_4)_2S$) and stirred at room temperature for 30 minutes. $(NH_4)_2S$ reacted with $Pb(NO_3)_2$ stoichiometrically and produced PbS precipitates according to Eq. 1:

$(NH_4)_2S + Pb(NO_3)_2 \rightarrow PbS + 2(NH_4)(NO_3)$ (Eq. 1)

The PbS precipitates were separated by centrifuge and washed two times by $H_2O$ and two more times by acetone. The final PbS products were dried under dynamic vacuum (ca. 200 mT) for 6 hours and weighed as W mg. The molar concentration of $(NH_4)_2S$ solution (mmol/mL) was determined as:

$$\frac{1000W}{331*400}$$

3.3 Room Temperature Synthesis of CdS NCs (CdS-1, CdS-2, and CdS-3)

The $Cd(OA)_2$ solutions were prepared by reacting CdO and oleic acid at molar ratio of ca. 1:2.6 in octadecene solution at 240° C. under nitrogen. The concentration was ca. 0.22 mmol/mL. The $(NH_4)_2S$ solutions (ca. 0.22 mmol/mL) were prepared by dissolving $(NH_4)_2S$ into oleylamine and dried by activated 3 Å molecular sieves (ca. 1 g molecular sieves were used to dry 1.3 mmol $(NH_4)_2S$). The syntheses of CdS NCs were carried out by combining $Cd(OA)_2$ and $(NH_4)_2S$ solutions in a capped vial and stirring for 30 minutes in air at room temperature. CdS-1 NCs were synthesized using $Cd(OA)_2$:$(NH_4)_2S$ molar ratio of 1:1. CdS-2 and CdS-3 were synthesized using $Cd(OA)_2$:$(NH_4)_2S$ molar ratio of 2.8:1 and 4.2:1, respectively. The NCs products were precipitated out by adding ethanol and separated by centrifuge. The products were purified by washing in hexane/ethanol with one additional wash. To determine the yield of CdS-1, ICP analyses were performed on the purified NCs products to get the content of Cd in the final product. In a typical reaction, 1.1 mmol of $Cd(OA)_2$ were loaded as starting material and 345 mg CdS-1 NCs were collected as the final product. ICP studies showed that the final product had a Cd content of 33.97% (weight). Then the conversion yield based on Cd was calculated by:

$$\frac{345 \times 33.97\%}{112.4 \times 1.1} \times 100\% = 94.8\%.$$

The same method was used to calculate the conversion yields of the other metal sulfide NC products within the context of the embodiments.

3.4 Synthesis of CdS NCs at Higher Temperatures (100-200° C.)

In a typical synthesis, a mixture of 0.14 g CdO, 1 mL oleic acid and 4 mL octadecene was heated at 240° C. under nitrogen until the solution became clear. The temperature was lowered to 110° C. and the solution was vacuumed to remove excess water. The reaction solution was then heated to 180° C. and 2 mL 0.26 mmol/mL molecular sieve-dried $(NH_4)_2S$ oleylamine solution was injected. The reaction was allowed to proceed for 10 mins and cooled down by water bath. Ethanol was added to the solution to precipitate out NCs, which were separated by centrifugation and washed one more time with hexanes/ethanol. The purified NCs were dissolved in hexanes.

3.5 Synthesis of $Ag_2S$ NCs

In a typical synthesis of $Ag_2S$-2, a mixture of 300 mg AgCl and 3 mL trioctylphosphine (TOP) was heated to 80° C. under nitrogen until the solution is clear. Oleylamine (3 mL) was then added and the solution was cooled to room temperature (ca. 30° C.). Molecular sieve-dried $(NH_4)_2S$ oleylamine solution (2 mL, 0.13 mmol/mL) was added to reaction solution and the reaction was allowed to proceed for 5 mins. Methanol was added to the solution to precipitate out NCs, which were separated by centrifugation and washed one more time with hexanes/ethanol. The purified NCs were dissolved in hexanes. $Ag_2S$-1 and $Ag_2S$-2 were synthesized by using different AgCl:$(NH_4)_2S$ ratios of 16:1 and 8:1, respectively. ICP analyses of $Ag_2S$-1 (wt %): Ag, 56.47; S, 5.90.

3.6 Synthesis of $Bi_2S_3$ NCs $Bi_2S_3$-1: A mixture of 90 mg bismuth(III) acetate and 2 mL dodecane thiol was vacuumed at room temperature to remove acetic acid and form bismuth dodecanethiolate complexes. Dichlorobenzene (4 mL) was then added to dissolve the bismuth dodecanethiolate complexes and 4 mL molecular sieve-dried $(NH_4)_2S$ oleylamine solution (0.09 mmol/mL) was added at room temperature. The reaction was allowed to proceed for 5 mins. Ethanol was added to the solution to precipitate out NCs, which were separated by centrifugation and washed one more time with hexanes/ethanol. The purified NCs were dissolved in hexanes and stored inside a glove-box.

$Bi_2S_3$-2: A mixture of 200 mg triphenyl bismuth, 1 mL oleic acid and 10 mL ODE was heated at 120° C. for 30 minutes. Temperature was lowered to 90° C. and the solution was vacuumed to remove benzene. The temperature of reaction solution was stabilized at 60° C. and 3 mL molecular sieve-dried $(NH_4)_2S$ oleylamine solution (0.11 mmol/mL) was injected. The reaction was allowed to proceed for 1 min and cooled down by water bath. Ethanol was added to the solution to precipitate out NCs, which were separated by centrifugation and washed one more time with hexanes/ethanol. The purified NCs were dissolved in hexanes and stored inside a glove-box.

3.7 Synthesis of $Cu_2S$ NCs

In a typical synthesis, a mixture of 1 g copper (I) chloride and 10 mL oleylamine was heated at 80° C. until the solution became clear. Temperature was then lowered to ca. 50° C. (the lowest temperature to maintain a clear copper (I) chloride oleylamine solution) and 10 mL molecular sieve-dried $(NH_4)_2S$ oleylamine solution (0.5 mmol/mL) was added. The reaction was kept for 5 mins and the reaction flask was then immersed into an oil bath which has been pre-heated to 180° C. The reaction was allowed to proceed for 40 mins and cooled down by removing oil bath. Ethanol was added to the solution to precipitate out NCs, which were separated by centrifugation and washed one more time with hexanes/ethanol. The purified NCs were dissolved in hexanes. The conversion yield based on Cu was ca. 87%. ICP analyses of $Cu_2S$ NCs synthesized at 50° C. (wt %): Cu, 55.57; S, 11.72.

3.8 Synthesis of SnS NCs

In a typical synthesis, a mixture of 260 mg tin (II) acetate, 2 mL oleic acid, and 3 mL ODE was heated at 80° C. until the solution became clear. The reaction solution was vacuumed at 80° C. for 45 mins to remove acetic acid. Trioctylphosphine (TOP, 5 mL) was then added and the reaction solution temperature was stabilized at 80° C. Molecular sieve-dried $(NH_4)_2S$ oleylamine solution (2 mL, 0.26 mmol/mL) was added at 80° C. The reaction was allowed to proceed for 2 mins and cooled down by water bath. Ethanol was added to the solution to precipitate out NCs, which were separated by centrifugation and washed one more time with hexanes/ethanol. The purified NCs were dissolved in hexanes.

3.9 Synthesis of ZnS NCs

A mixture of 60 mg $ZnCl_2$, 5 mL oleylamine, and 5 mL TOP was heated to 320° C. Molecular sieve-dried $(NH_4)_2S$ oleylamine solution (4 mL, 0.23 mmol/mL) was injected at 320° C. The reaction was allowed to proceed for 3 mins and cooled down by a room temperature oil bath. Ethanol was added to the solution to precipitate out NCs, which were separated by centrifugation and washed one more time with hexanes/ethanol. The purified NCs were dissolved in hexanes.

3.10 Synthesis of MnS NCs

A mixture of 55.6 mg $MnCl_2$, 8 mL oleylamine, and 2 mL oleic acid was heated to 250° C. Molecular sieve-dried $(NH_4)_2S$ oleylamine solution (4 mL, 0.23 mmol/mL) was injected at 250° C. The reaction was allowed to proceed for 5 mins and cooled down by a water bath. Ethanol was added to the solution to precipitate out NCs, which were separated by centrifugation and washed one more time with hexanes/ethanol. The purified NCs were dissolved in hexanes.

All references, including publications, patent applications, and patents cited herein are hereby incorporated by reference in their entireties to the extent allowed, and as if each reference was individually and specifically indicated to be incorporated by reference and was set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein is merely intended to serve as a shorthand method of referring individually to each separate value falling within the range, unless otherwise indicated herein, and each separate value is incorporated into the specification as if it was individually recited herein.

All methods described herein may be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A synthetic method comprising reacting at a temperature of less than about 150° C. in an organic solvent material comprising a primary organic amine, a metal material, and an ammonium chalcogenide material, to form a metal chalcogenide nanocrystal material, wherein the metal chalcogenide nanocrystal material has a dispersity less than 10 percent.

2. The method of claim 1 wherein the organic solvent material comprises an anhydrous organic solvent material.

3. The method of claim 1 wherein the metal material is selected from the group consisting of a metal oxide, a metal coordination complex and a metal salt.

4. The method of claim 3 wherein the metal material comprises a metal cation selected from the group consisting of Ti, Mn, Fe, Co, Ni, Cu, Zn, Ga, Mo, Ag, Cd, In, Sn, Sb, W, Hg, Pb, and Bi metal cations.

5. The method of claim 3 wherein the metal salt comprises an anion selected from the group consisting of carboxylate, diketonate, halide, perchlorate and amide anions.

6. The method of claim 1 wherein the ammonium chalcogenide is selected from the group consisting of ammonium sulfide, ammonium selenide and ammonium telluride.

7. The method of claim 1 wherein the reacting is undertaken at a temperature less than about 100 degrees centigrade.

8. The method of claim 1 wherein the reacting is undertaken at a temperature less than about 50 degrees centigrade.

9. The method of claim 1 wherein the solvent material further comprises a surfactant material.

10. The method of claim 1 wherein the method comprises a heat-up method.

11. The method of claim 1 where the metal chalcogenide nanocrystal material comprises at least one of a bismuth sulfide material and a silver sulfide material.

12. A synthetic method comprising reacting in an anhydrous organic solvent material comprising an anhydrous primary organic amine at a temperature less than 100 degrees centigrade a metal material and an ammonium chalcogenide material to form a metal chalcogenide nanocrystal material, wherein the reacting produces greater than 30 grams of metal chalcogenide nanocrystal material in a single reaction batch.

13. The method of claim 12 wherein the metal material is selected from the group consisting of a metal oxide, a metal coordination complex and a metal salt.

14. The method of claim 13 wherein the metal material comprises a metal cation selected from the group consisting of Ti, Mn, Fe, Co, Ni, Cu, Zn, Ga, Mo, Ag, Cd, In, Sn, Sb, W, Hg, Pb, and Bi metal cations.

15. The method of claim 13 wherein the metal salt comprises an anion selected from the group consisting of carboxylate, diketonate, halide, perchlorate and amide anions.

16. The method of claim 12 wherein the ammonium chalcogenide material is selected from the group consisting of ammonium sulfide, ammonium selenide and ammonium telluride.

17. The method of claim 12 wherein the solvent material further comprises a surfactant material.

18. The method of claim 12 wherein the metal chalcogenide nanocrystal material has a dispersity less than 10 percent.

* * * * *